United States Patent
Verdiell

(10) Patent No.: US 6,586,726 B2
(45) Date of Patent: Jul. 1, 2003

(54) OPTICAL ELECTRONIC ASSEMBLY HAVING A FLEXURE FOR MAINTAINING ALIGNMENT BETWEEN OPTICAL ELEMENTS

(75) Inventor: Jean-Marc Verdiell, Palo Alto, CA (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 09/812,267

(22) Filed: Mar. 19, 2001

(65) Prior Publication Data

US 2001/0017376 A1 Aug. 30, 2001

Related U.S. Application Data

(62) Division of application No. 09/229,395, filed on Jan. 11, 1999, now Pat. No. 6,207,950.

(51) Int. Cl.$^7$ .............................. G02B 6/36; H01L 23/02
(52) U.S. Cl. ..................... 250/239; 385/92; 257/678
(58) Field of Search ......................... 250/239, 216, 250/227.11, 227.24, 227.28, 551; 385/88, 90, 91, 92, 93, 94, 137; 257/433, 678, 703, 704

(56) References Cited

U.S. PATENT DOCUMENTS

| | | | | |
|---|---|---|---|---|
| 5,123,074 A | * | 6/1992 | Yokota et al. | ................. 385/95 |
| 5,132,532 A | * | 7/1992 | Watanabe | .................... 250/239 |
| 5,195,155 A | * | 3/1993 | Shimaoka et al. | ............. 385/90 |
| 5,553,180 A | * | 9/1996 | Belenkiy et al. | .............. 385/59 |
| 5,569,958 A | * | 10/1996 | Bloom | ........................ 257/698 |
| 5,619,609 A | * | 4/1997 | Pan et al. | .................... 385/136 |
| 6,252,726 B1 | * | 6/2001 | Verdiell | ....................... 385/88 |

* cited by examiner

Primary Examiner—Kevin Pyo
(74) Attorney, Agent, or Firm—Blakely, Sokoloff, Taylor & Zafman LLP

(57) ABSTRACT

A package for optical components and a method for making the package are disclosed. The package comprises a quasi-planar substrate having a positioning floor, a platform and an optional ring frame of precisely determined height. Optical components picked and placed on a substrate floor, a raised platform and frame. A flexure assembly allows fine positioning of components requiring critical optical alignment.

10 Claims, 7 Drawing Sheets

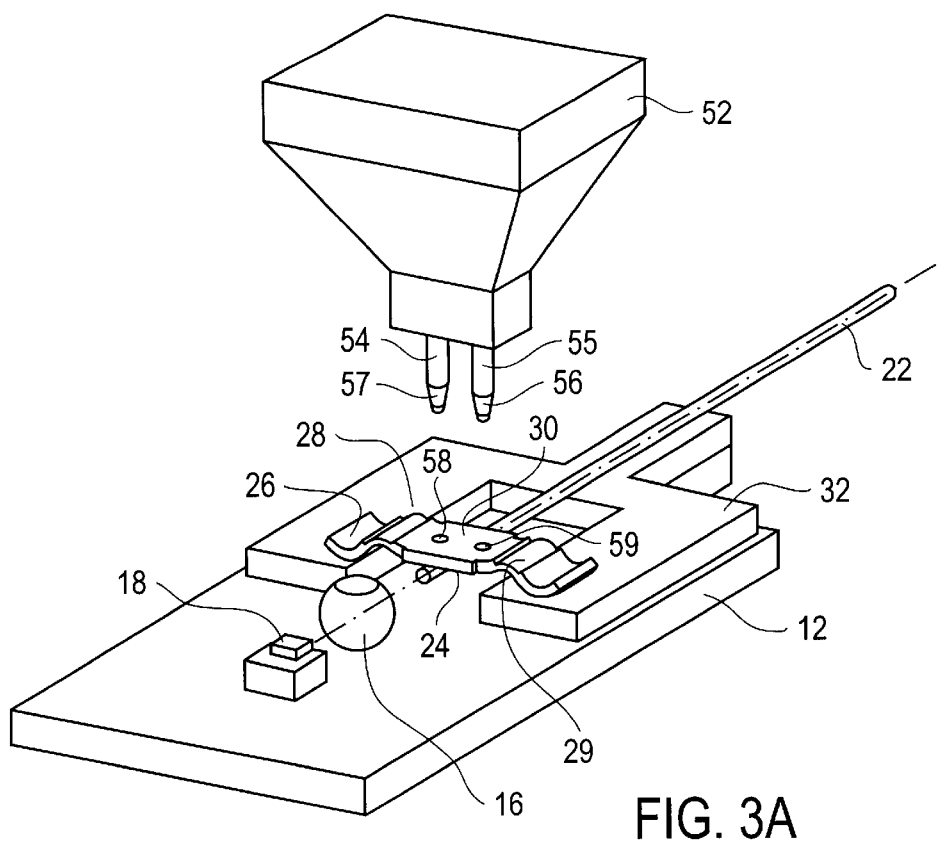
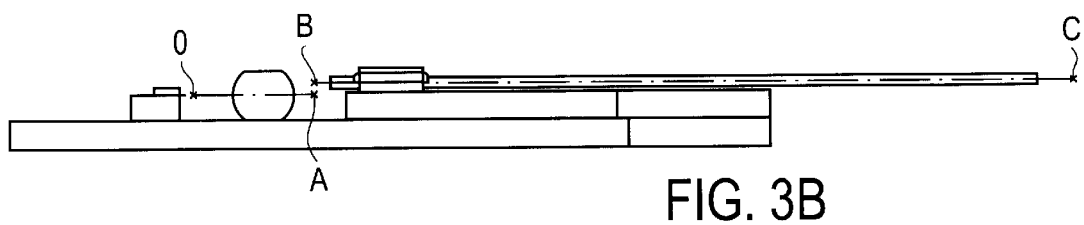
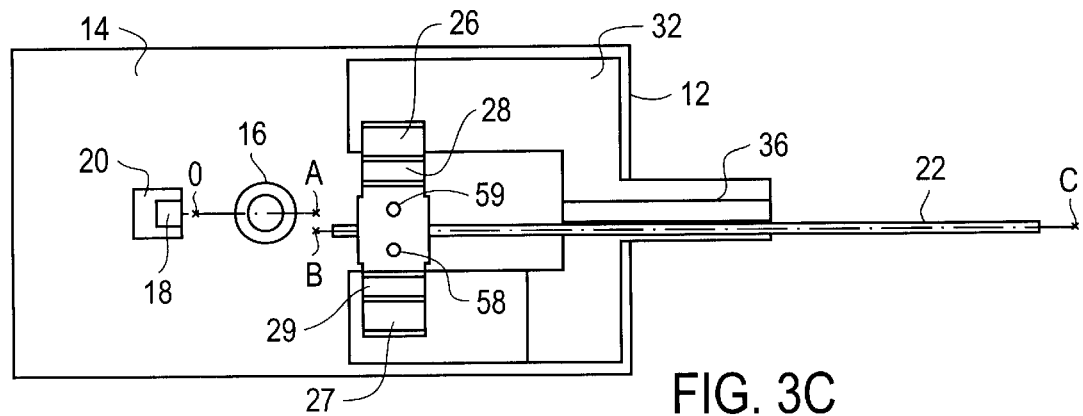
FIG. 3A
FIG. 3B
FIG. 3C

OPTICAL ELECTRONIC ASSEMBLY HAVING A FLEXURE FOR MAINTAINING ALIGNMENT BETWEEN OPTICAL ELEMENTS

This application is a Divisional of prior application Ser. No. 09/229,395, filed Jan. 11, 1999, now U.S. Pat. No. 6,207,950, entitled "An Optoelectronic Assembly".

FIELD OF THE INVENTION

The present invention relates generally to optoelectronic assemblies having optical components and methods for making the same; more particularly, the present invention relates to an assembly having optical components mounted on a quasi-planar substrate and a flexure and methods for making the same.

BACKGROUND OF THE INVENTION

Sealed packages are necessary to contain, protect, couple to optical fibers and electrically connect optoelectronic components. Optoelectronics packaging is one of the most difficult and costly operations in optoelectronics manufacturing. Optoelectronic packages provide submicron alignment between optical elements, high-speed electrical connections, excellent heat dissipation, and high-reliability. Providing such features has resulted in optoelectronic packages that are an order of magnitude larger, costlier and difficult to manufacture than electronic packages, particularly for fiber coupled devices. In addition, current designs of optoelectronic packages and associated fabrication processes are ill adapted for automation because today's high-performance butterfly packages are characterized by a large multiplicity of mechanical parts (submounts, brackets, ferrules . . . ), three-dimensional (3D) alignment requirements, and poor mechanical accessibility.

U.S. Pat. No. 4,953,006 by Kovatz discloses a package for an edge-coupled optoelectronic device. The package includes a cover with a window, so that optoelectronic device, such as, for example, a laser, may be coupled to external optics, such as a lens or an optical fiber. Although this package provides hermeticity and high-speed electrical connections, it does not provide for a way to mount and align collimation or coupling optics nor optical fibers.

U.S. Pat. No. 5,005,178 by Kluitmans and Tjassens and U.S. Pat. No. 5,227,646 by Shigeno also disclose packages for optical and optoelectronic components. Kluitmans et al. discuss a package for a laser diode coupled to an optical fiber. The package includes a conducting rod so that the laser may be used at high speed. Shigeno describes a heat sink for cooling an enclosed laser diode, where the laser diode is preferably coupled to an optical fiber. However, in both of the above patents, it is difficult to align the laser diode with the optical fiber when constructing the package. Both designs use numerous parts in complex 3D arrangements and are unsuitable for automated assembly. U.S. Pat. No. 5,628,196 by Farmer discloses a package including a heat sink for a semiconductor laser, but provides no efficient means for coupling the laser to other optics.

Embodiments of the present invention overcome the limitations in the prior art.

SUMMARY OF THE INVENTION

An optoelectronic package is described. In one embodiment, the optoelectronic package includes a substrate having a floor, a first optical element coupled to the substrate, a second optical element, and a flexure coupled to the second optical element and the substrate to optically align the second optical with the first optical element.

BRIEF DESCRIPTION OF THE DRAWINGS

The present invention will be understood more fully from the detailed description given below and from the accompanying drawings of various embodiments of the invention, which, however, should not be taken to limit the invention to the specific embodiments, but are for explanation and understanding only.

FIG. 3A shows a perspective view of the assembly before alignment of the flexure with a removable positioning tool.

FIG. 3B shows a side view of the assembly before alignment of the flexure.

FIG. 3C shows a top view of the assembly before alignment of the flexure.

DETAILED DESCRIPTION OF THE PRESENT INVENTION

Figure 1:
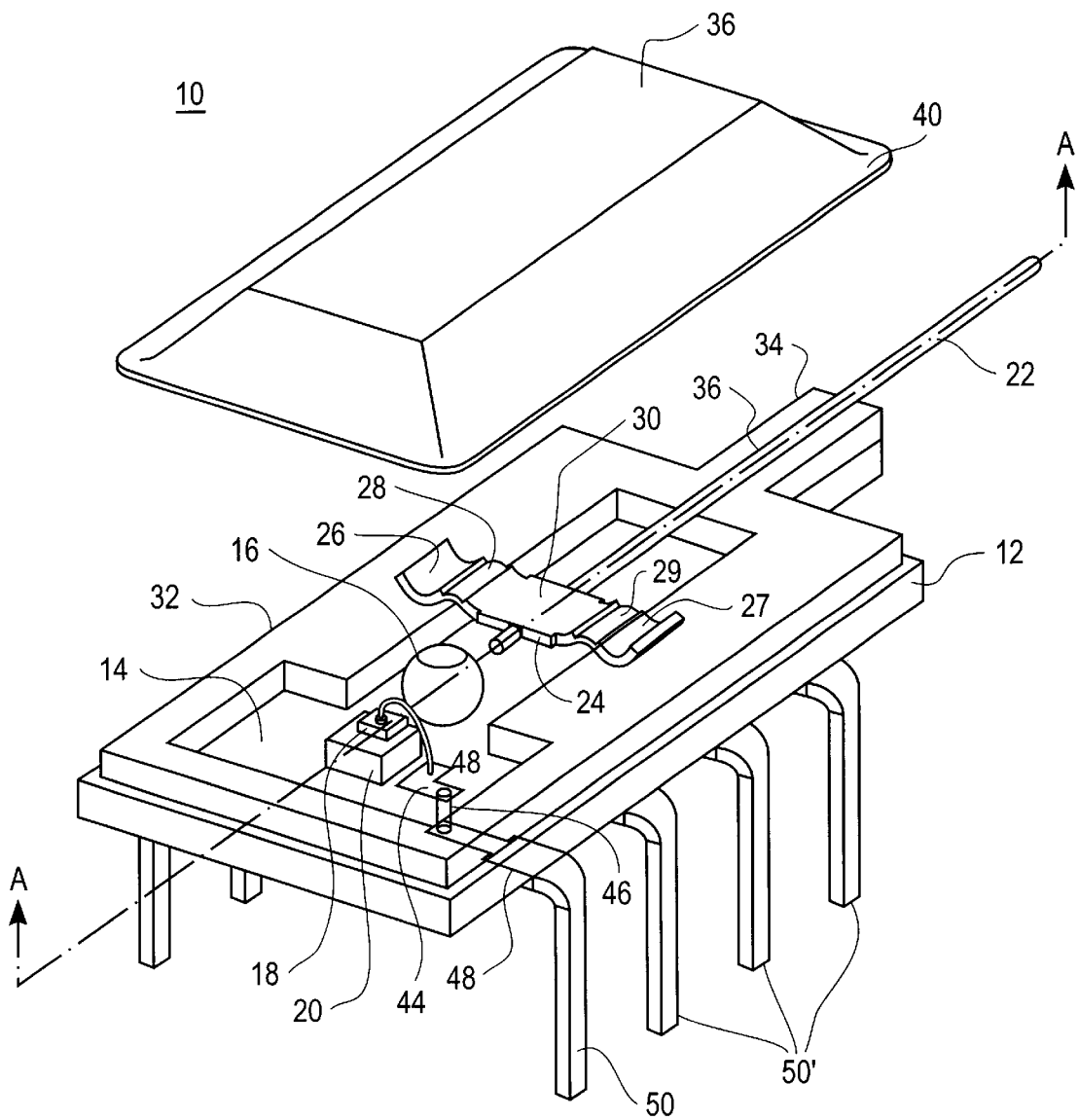
FIG. 1 shows one embodiment of an optoelectronic package assembly.

An optoelectronic assembly is described. In the following description, for purposes of explanation, numerous specific details are set forth in order to provide a thorough understanding of the present invention. It will be apparent, however, to one skilled in the art that the present invention can be practiced without these specific details. In other instances, well-known structures and devices are shown in block diagram form in order to avoid obscuring the present invention.

Overview

A package for optoelectronic components and a method for making the package are disclosed. In one embodiment, the package comprises a substrate having a positioning floor which provides a mounting surface and the package bottom wall. In one embodiment, the substrate and its positioning floor are substantially planar. In one embodiment, one or more raised platforms are also provided on the mounting surface. The raised platforms may be submounts made of a high thermal conductivity material, such as, for example, copper tungsten, Aluminum Nitride, Berillyum Oxide, and Boron Nitride, attached to the floor of the substrate. The raised platforms may be attached, for example, by soldering or brazing, or may even be part of the substrate material itself.

In one embodiment, edge emitting, side mounted, or waveguide devices, such as, for example, diode lasers, modulators, detectors, are mounted on the raised platforms. Micro-optical elements such as, for example, micro-lenses, filters, splitters, isolators, are mounted directly on the package floor.

In one embodiment, the height of the platform and the height of the optical elements are chosen such that the edge emitting devices and the optical elements are automatically vertically aligned, i.e. their optical axis lies in the same common plane parallel to the package floor. The raised platform for the edge emitting devices may serve up to three purposes at a time: (i) providing the height adjustment that brings the edge-emitting device into the optical plane, (ii) serving as a heat spreader for the active device, and (iii) providing electrical contact(s) to the active device.

In one embodiment, the height of the platforms and frame is kept at a small fraction, e.g., less than a tenth, of the length of the substrate, so that the assembly is essentially two dimensional and can be manufactured using pick and place automation. For example, to realize an industry standard Butterfly package following an embodiment described above, the substrate outside dimensions are close to 20 mm long by 12 mm wide, while the height of the frame and platforms is 0.25 mm. This represents only about 1/80 of the length of the package. This is in stark contrast with conventional Butterfly packages whose walls height is typically on the order of 10 mm. The quasi-planarity of the substrate, frame and platform assembly enables placement of the optoelectronic elements by a high-precision pick and place machine equipped with two-dimensional (2D) machine vision. State of the art, commercially available machines can achieve pick and place precision of less than one micron. An example of such a machine is the model FC 250 flip chip bonder by Karl Suss Technique, Saint-Jeoire, France. Using such automated pick and place assembly, the optical relationship between the optoelectronic elements can be established in the lateral and transverse dimensions within a few microns of precision.

The height alignment between components is automatically set by the height of the raised platform. Using precise control of the submount material or a polishing technique, one can achieve a platform height control to within a micron or less. Because the package is quasi-planar, mechanical stability is mainly determined by the stability of the substrate. By using a very low expansion materials for the substrate like Alumina ceramic, one obtains a package with much better mechanical stability than conventional three dimensional approaches.

Note that although embodiments of optoelectronic packages are described herein having one or more optical elements on platforms, it is well within the teaching of the present invention to position such elements on the package floor while having other optical elements of the package mounted below the top surface of the package floor.

In high performance opto-electronic packages, critical optical elements require more precise placement than can be obtained with the combination of platform height control and two-dimensional pick and place. This is the case of single mode fibers, which have to be aligned within less than a micron precision to achieve high optical coupling efficiency. In one embodiment, such components are mounted using a miniature flexure which allows for a small amount of vertical adjustment. In one embodiment, the flexure is made of thin spring steel that has been etched or stamped, then bent in a press. The flexure may comprise of two or more legs which rest on the substrate or on each side of the frame. In one embodiment, the legs are joined by a bridge that supports or clamps the optical element. Two sections of material with spring property join the legs to the bridge.

The flexure may be designed so that in its natural (non-flexed) state, the optical axis of the optical component attached to the bridge rests slightly above the optical plane of the package. Final adjustment of the height is obtained by applying pressure to the flexure, therefore lowering the bridge height. Dragging the flexure in the plane parallel to the plane of the substrate may be preferred to correct the lateral position. When adequate alignment is reached, the legs are permanently attached to the frame or substrate. The attachment may be by, for example, laser welding, soldering or adhesive bonding. In another refinement of the flexure design, the flexure has more than two legs. The first pair of legs is attached to the frame after coarse optical alignment. The flexure is then finely realigned, using the residual flexibility left after the two first legs are attached. When the optimum position is reached, the remaining legs are attached.

Another key property of one embodiment of an optoelectronic package described below is hermeticity. In standard designs, this is achieved by adding walls around the package in which holes have been drilled to allow the passage of electrical connections, optical windows and optical fibers, which need to be properly sealed after they are installed. The optical package is then constructed inside the confines of such walls, and a sealing lid is added to seal up the package as the last manufacturing step. Drilling the walls and sealing all electrical and optical feedthroughs going through such holes adds cost and complexity to the packages. For example, a commercial Butterfly box with high-speed electrical ceramic feedthroughs and a Kovar tube feedthrough for an optical fiber costs in excess of $200 before any optical components are added. Embodiments of the optoelectronic package described herein provide a much simpler and cost effective solution for hermeticity, without the need for added walls. In one embodiment, hermeticity is obtained by using a top-hat cap whose rim is sealed to the outer portion of a ring frame. A shallow groove may be provided in the ring frame to allow for the sealed passage of an optical fiber from the inside to the outside of the hermetic enclosure. Sealed electrical connections with the exterior of the enclosure are provided by filled vias through the bottom of the substrate.

In yet another embodiment, distribution of electrical signals to pins outside of the package and electrical and optoelectronic components inside the hermetic enclosure is facilitated by a set of electrical connections printed directly on the top and bottom of the substrate as a set of patterns. The top and bottom electrically conductive patterns are electrically connected by the hermetic filled vias. Hence distributing the signals to pins at the periphery of the package, or to a ball grid array or similar structure, underneath the package can be accomplished without any additional wiring nor expensive through-wall hermetic feedthroughs. This configuration is very advantageous for high-speed operation: vias are very short since they only need to go through the thickness of the substrate material, which in one embodiment is on the order of 250 $\mu$m. In addition, all extraneous wiring is virtually eliminated. This greatly reduces the amount of parasitic capacitance and inductance that would otherwise limit the high-speed operation of the package.

The quasi-planar substrate with raised platforms, in conjunction with the flexure, simultaneously provides a high-precision optical alignment bench, heatsinking for active optoelectronic components, sealed electrical feedthroughs, a high-speed wiring board, and an hermetically sealable enclosure.

Thus, at least one embodiment of the present invention provides a package for optical components such that the components are easily and precisely aligned within a package. Such a package may be manufactured inexpensively and in an automatable method.

In some embodiments of the optical package of the present invention may be advantageous in that it may be mass-produced at a low cost while maintaining a precision alignment of the optical components within the package, along with the hermeticity, high mechanical stability, good heat sinking, and high-speed electrical operation of the package.

FIG. 1 shows one embodiment of an optoelectronic assembly, package 10, with frame 32 and flexure 24. Assembly comprises a substrate 12 with a positioning floor 14. In one embodiment, positioning floor 14 is substantially planar, and substrate 12 comprises an electrically isolating material with a low coefficient of thermal expansion, such as alumina or beryllium oxide. In one embodiment, raised platform 20 is created by a submount attached to positioning floor 14.

Optical elements, or components, are mounted on positioning floor 14 and platform 20. In one embodiment, a lens 16 is mounted on substrate 12, and an edge emitting optoelectronic element 18, such as, for example, a laser diode, is mounted on platform 20. Other optical components may be used.

An optical element 22 is attached to on flexure 24, by, for example, soldering, brazing or welding. In one embodiment, flexure 24 comprises two legs 26 and 27, a bridge 30, and two spring regions 28 and 29 at the junction of legs 26 and 27 and bridge 36. In one embodiment, element 22 is a single mode optical fiber, but it may be any element that requires optical alignment with other optical elements.

A frame 32 may be attached to substrate 12. The ends of legs 26 and 27 are attached to frame 32. Flexure 24 and attachment method 5 will be discussed in more detail below. In one embodiment, frame 32 has a protruding arm 34 having a groove 36. Groove 36 permits the hermetic passage of the fiber 22 to the outside of the package.

A cap 38 is attached to frame 32, creating an airtight seal. By enclosing and hermetically sealing positioning floor 14, the optical components within are kept in a controlled gaseous, liquid or vacuum environment that protects them and prevents degradation in their performance and/or lifetime. In one embodiment, cap 38 has a top hat shape and an peripheral lip 40 that can be hermetically sealed to the outside portion of frame 32 and on top of grove 36 and fiber 22. The hermetic seal may be created by a process such as seam welding, soldering or adhesive bonding.

Thickness of frame 32, platform 20, optical element 16 and 18 are kept small compared to length or width of substrate 12, so that the assembly is essentially planar and compatible with pick and place automated assembly using two-dimensional machine vision. Thickness of frame 32 and platform 20 are preferably less than $1/10$ of the length of substrate 12, and thickness of optical element 16 is preferably less than $1/5$ of that length. In one embodiment, thickness of frame 30 and platform 20 is 0.250 millimeters, height of lens 16 is 0.5 millimeter, and length of substrate 12 is about 10 millimeters.

In one embodiment, wire bond 42 connects active optical element 18 to electrically conductive pattern 44 which is on the top side of positioning floor 14. Filled conductive via 46 hermetically connects pattern 44 to electrically conductive pattern 48 on the bottom side of positioning floor 14. Pins 50 on the bottom side of positioning floor 14 are also provided for connections to electronic component inside the package through other vias (not shown). The combination of patterns 48 and 44 and filled via 46 provide an efficient and low-parasitic mechanism for hermetically distributing electrical signals from optoelectronic elements inside the hermetic enclosure to pins 50 at the periphery of package 10. Alternatively, signals can be distributed to ball grid array underneath the package for surface mounting.

In one embodiment, package 10 is realized without frame 32, and the material of substrate 12 allows cap 38 and flexure 24 to be attached directly onto substrate 12. In this case, the ability to form groove 36 may be lost, but can be replaced by the addition of a feedthrough tube or a window on cap 38.

In an alternative embodiment, flexure 26 is attached directly to floor 14, while cap 38 is attached to frame 32. In another alternative embodiment, frame 32 and platform 20 are metallic inserts of an entirely planar substrate. In yet another embodiment, two concentric frames are used, where an outer one on attaching cap 38 and an inner one for attaching flexure 24.

Figure 2A:
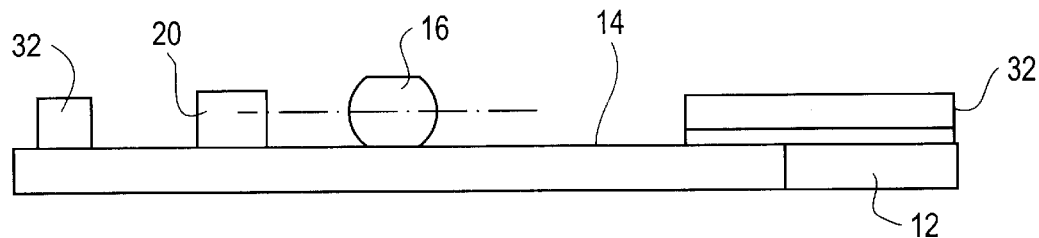
FIG. 2A shows a side sectional view of the frame assembly of FIG. 1 before planarization.

An axis A bisects package 10, as shown in FIG. 1. FIG. 2A is a cross-sectional view of assembly 10, taken along axis A. Since vertical alignment of the optical parts mounted on platform 20 and the positioning floor 14 is solely controlled by the height of platform 20, it is critical to precisely adjust this height. Typically, for aligning a laser diode to a microlens, a precision of better than 5 $\mu$m is required. In one embodiment, such precision may be attained by polishing platform 20 and frame 24 until frame 24 and platform 20, including the optical element mounted thereon, is reduced to the correct height.

Figure 2B:
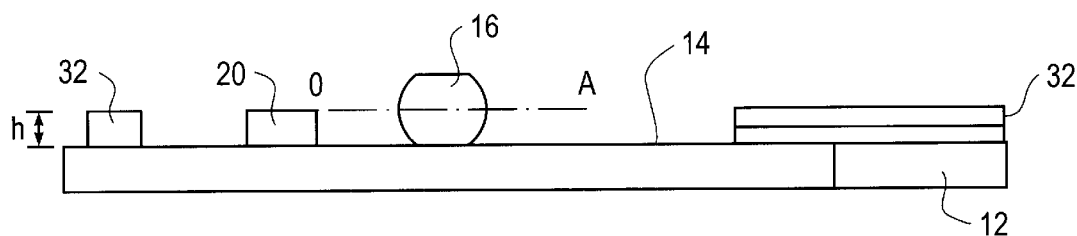
FIG. 2B shows the frame assembly of FIG. 2A after planarization of the frame and a raised platform.
Figure 2C:
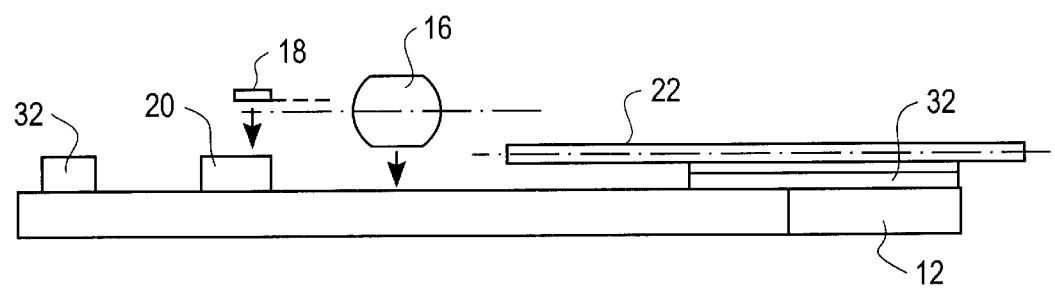
FIG. 2C shows how two optical components are positioned by pick and place automation onto the planarized substrate.

FIG. 2A shows substrate 12 with frame 24 and platform 20 before polishing step. The height of platform 20 and frame 24 above substrate 12 is slightly more than that of the optical axis of optical element 16 shown for reference. FIG. 2B shows frame 24 and platform 20, including optical element 16, after precision polishing, so that frame 32 and platform 20 have a predetermined height h above floor 14 which matches the optical axis of optical element 16, once again shown for reference. FIG. 2C shows optical elements being picked and placed on platform 20 and floor 14.

Figure 2D:
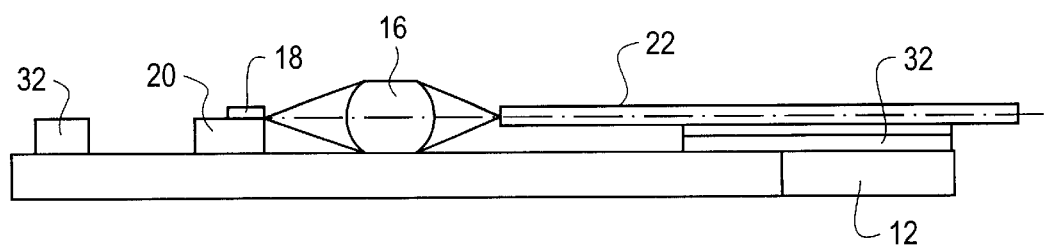
FIG. 2D shows the resulting optical alignment of the element in the vertical plane.

In one embodiment, element 18 is a laser diode, whose emitted light is collected and focused by element 16, which is a lens, into the core of optical element 22, which is an optical fiber. The alignment of laser, lens, and fiber is simplified by the planarization of frame 12 and platform 20, as shown in FIG. 2D. Optical plane P is a distance h from floor 16. The lens has an optical axis OA a distance from the bottom surface of the lens. Platform 20 has height h, and therefore a top surface of platform 20 lies in optical plane P. Thus light emitted from laser is substantially centered on optical plane P, and the light from the laser that strikes the lens is centered on optical axis OA, as shown in FIG. 2D.

In addition to the polishing technique, alternative techniques to achieve platform height control may be used, including, but not limited to, electroplating a slightly under-height platform to increase its thickness, precision chemical etching of a slightly over-height platform, or precision diamond machining of the platform.

FIGS. 4A, 4B, 4C, 5A and 5B describe a flexure alignment device and alignment method. In one embodiment, flexure 24 comprises a bridge 30 and two legs 26 and 27. Two spring regions 28 and 29 connect legs 26 and 27 to bridge 30. The extremities of legs 26 and 27 rest on frame 32. In an alternative design, the extremities of the legs rest directly onto substrate 12. Bridge 30 holds an optical element 22. In one embodiment, the optical element 22 comprises an optical fiber. In one embodiment, flexure 24 is preferably made from a flat stamped or etched piece of spring steel. Spring regions 28 and 29 can be created by chemically removing half of the metal thickness. Flexure 24, which is substantially flat, is then subsequently formed in a press to shape legs 26 and 27 and spring regions 28 and 29, then annealed at high temperature to confer spring properties to the material. In one embodiment, flexure 24 is about 170 microns thick, and spring regions 28 and 29 are approximately 85 microns thick. It will be clear from the following how legs 26 and 27, bridge 30 and spring regions 28 and 29 are designed to allow for precise three-dimensional alignment of optical element 22.

Figure 4A:
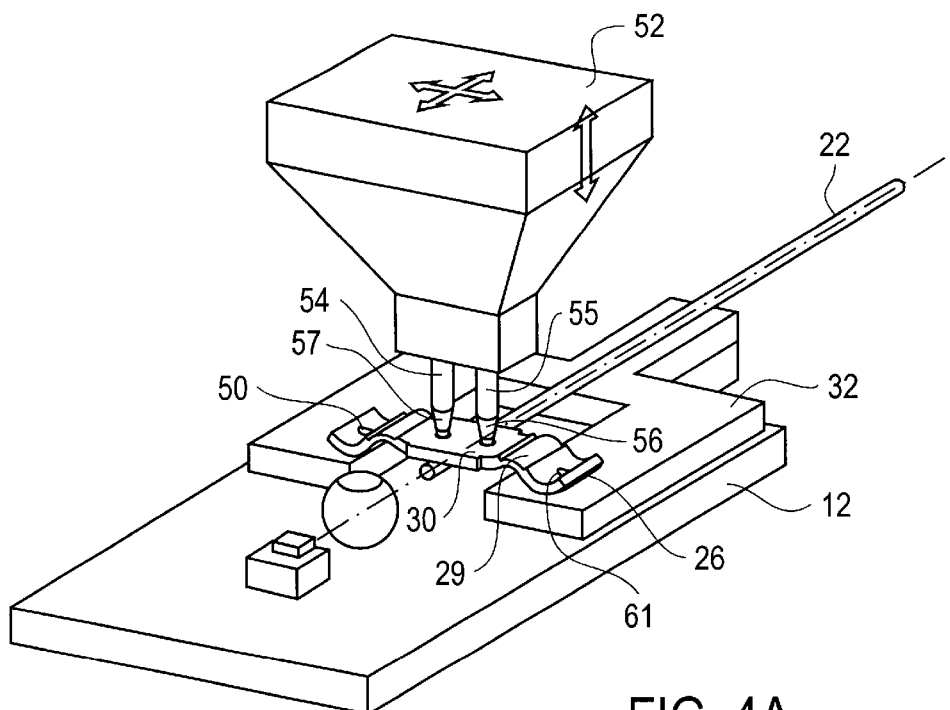
FIG. 4A shows a perspective view of the assembly with the flexure being aligned using the removable positioning tool.
Figure 4B:
FIG. 4B shows a side view of the assembly after alignment and final attach of the flexure legs.
Figure 4C:
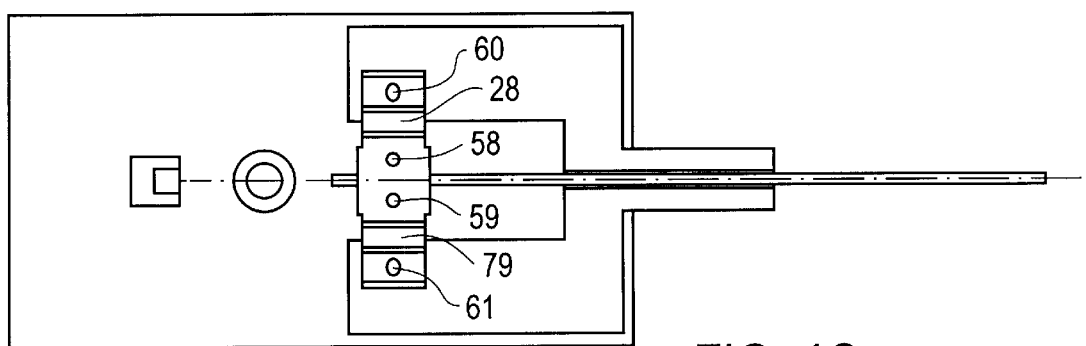
FIG. 4C shows a top view of the assembly after alignment and attach of the flexure legs.

The process begins by first attaching optical element 22 to bridge 30 of flexure 24 by a process such as, for instance, soldering or adhesive bonding. Flexure 24 and its attached optical element are then picked and dropped in rough alignment on optical assembly 10 as shown in FIG. 4A. At this point, flexure 24 simply rests on frame 32 (or on substrate 12, in a ring-less embodiment), with no further attachment method. At least one first optical element 16 is already attached to optical assembly 10 and defines an optical axis OA, with respect to which optical element 22 and its optical axis BC will be aligned using flexure 24. In one embodiment, a laser diode 18 and a lens 16 are attached on the optical assembly before flexure 24 is aligned. In one embodiment, flexure 24 is designed such that optical axis BC is higher than optical axis OA, as shown in the side view of assembly 10 on FIG. 3B. In one embodiment, BC is about 100 to 200 microns higher than OA when no pressure is applied on flexure 24. The top view of the assembly in FIG. 3C shows that the axis OA and BC may also be offset from each other in the horizontal plane alignment of flexure 24.

Removable alignment tool 52 is used to apply pressure to the top of bridge 30. Tool 52 also features pins 55 and 54 with conical ends 56 and 57 which fit into matching gripping holes 58 and 59 on bridge 30. It should be clear that the shape of the alignment tool in FIGS. 4A and 5B is just given as an example. Other tools that provide the ability to temporarily clamp onto the flexure and apply pressure on bridge 30 can be designed by one skilled in the art. For example, matching sets of grooves in the flexure and tool can replace the pin and hole interlocking design. A vacuum tool can also be used.

During the fine alignment step, tool 52 is lowered onto bridge 30. Conical tips 56 and 57 are tightly fitted in holes 58 and 59. The tool applies pressure on bridge 30, causing spring regions 28 and 29 to bend under the pressure. This, in turn, causes legs 26 and 27 to spread apart and axis BC to lower into alignment to axis OA, as shown on FIG. 4B. Tool 52 is also moved in a plane parallel to the plane of mounting floor 14, dragging flexure 24 and legs 26 along with it until horizontal and longitudinal alignment of axis OA and BC is obtained, as can be see in the top view of FIG. 4C. In one embodiment, alignment is monitored by measuring coupled power at the output of the fiber while laser 18 is powered up and flexure 24 undergoes fine alignment. Once desired alignment is obtained, the leg extremities are attached to the ring frame 32 or substrate 12. One attachment process is laser microwelding through laser beam 62, which creates welding spots 60 and 61. Welding spots permanently attach metallic legs 26 to metallic ring frame 32. Other attachment processes may also be used, such as UV curable adhesives or soldering. After final attachment of the legs is complete, tool 52 is raised from the assembly, leaving the aligned assembly shown in FIGS. 4B and 4C.

Most attachment processes induce minute, undesirable shift or drift during the attachment operation. In the case of adhesives, shift is typically caused by the shrinkage of the adhesive; in the case of soldering, shift is caused by the change of solder volume during the solidification phase and by the expansion and contraction of parts during the temperature cycle; in laser welding, a post-weld shift is usually observed.

Figure 5A:
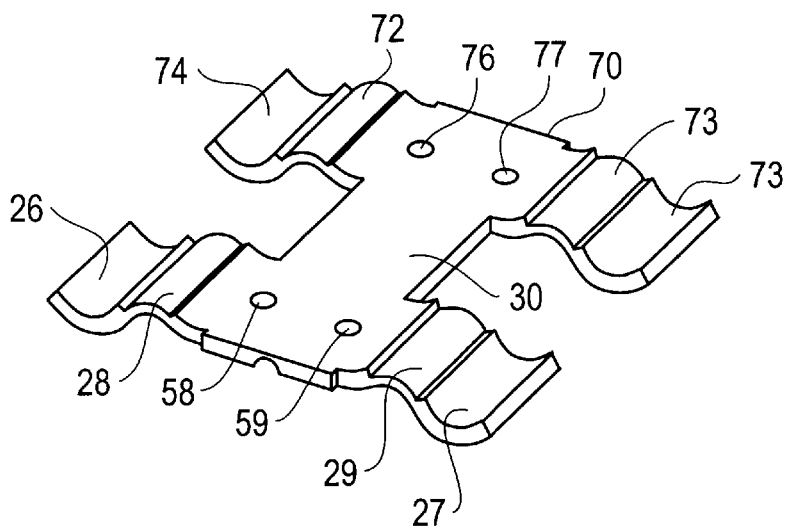
FIG. 5A illustrates one embodiment of a 4 legged flexure.
Figure 5B:
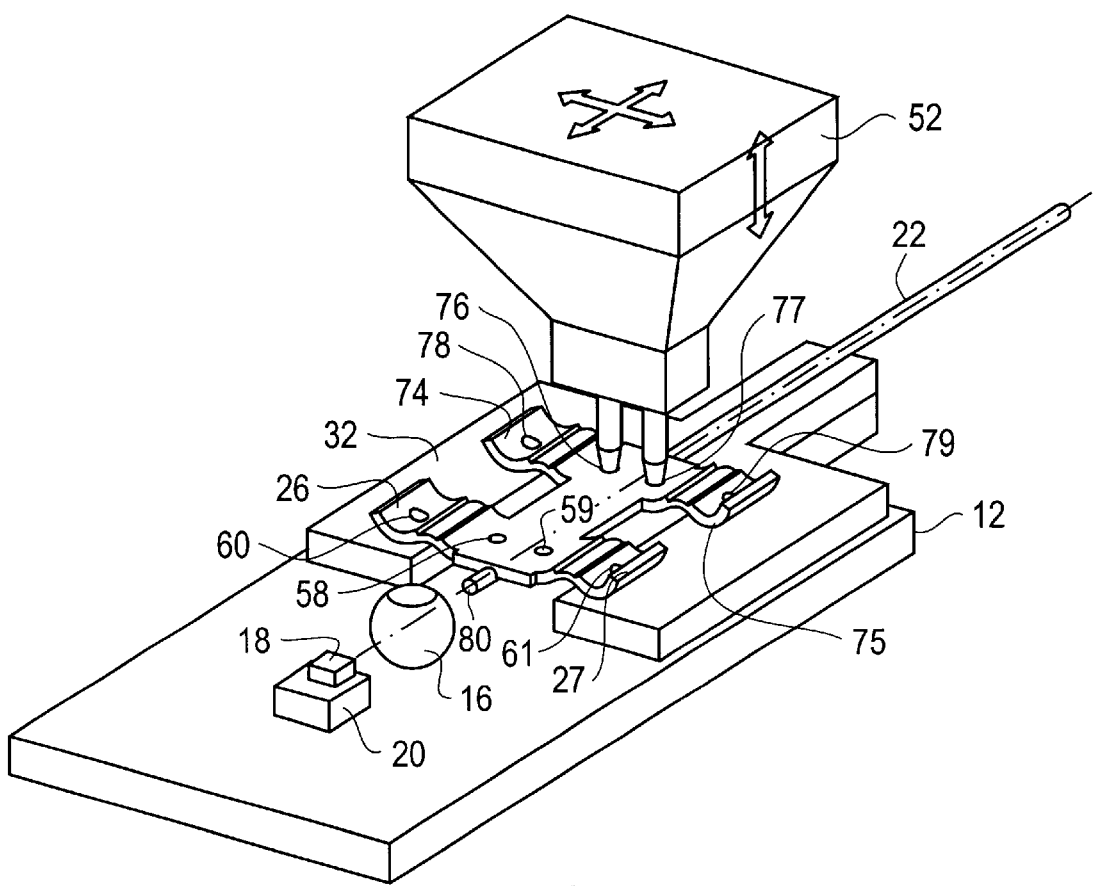
FIG. 5B shows the fine alignment step using the back legs of a 4 legged flexure.

FIG. 5A shows one flexure embodiment that reduces, or even minimizes, the effect of such shifts and allows greater alignment precision and reproducibility. Flexure 70 of FIG. 5A comprises two pairs of legs, a front pair of legs 26 and 27 and a rear pair of legs 74 and 75. The front pair of legs is located close to optical element 16 as shown in FIG. 6B, and is aligned using tool 52 and gripping holes 58 and 59 and following the previously described method. Front legs 26 and 27 are permanently attached to frame 32 as previously described, using for example laser welding spots 60 and 61. Post-attachment shift is corrected in a second alignment step by using tool 52 and rear gripping holes 76 and 77 located in proximity of the rear pair of legs 74 and 75. The residual flexibility of flexure 70 allows a small positioning correction of tip 80 of optical element 22 by moving rear of flexure 70 with tool 52. After second alignment, rear legs are attached to frame 32 by laser welding spots 78 and 79. Alignment tool 52 is then lifted from assembly.

Figure 6:
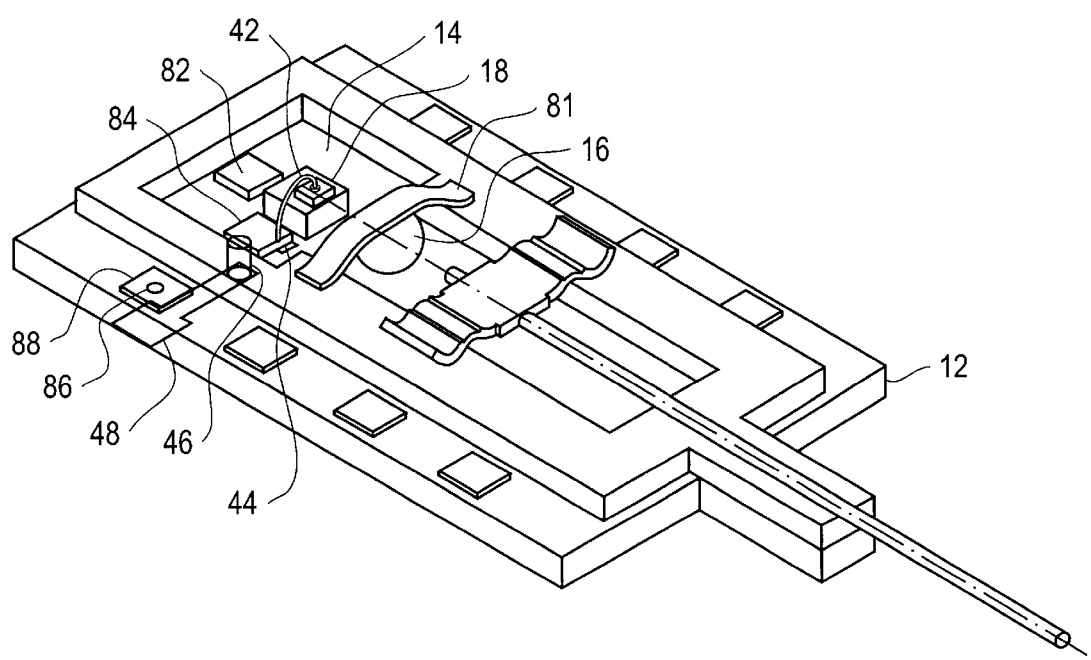
FIG. 6 shows an alternate embodiment with a spring leaf attachment of the optical element, additional electronics and sensors, and top facing peripheral contacts.

Although the detailed description contains many specifics for the purposes of illustration, anyone of ordinary skill in the art will appreciate that many variations and alterations to the following details are within the scope of the invention. FIG. 6 shows variations and further improvements of the package embodiment. In this embodiment, optical element 16 is pressed against positioning floor 14 by spring leaf 81 to maintain its position. Spring leaf 81 is attached to frame 32 by laser welding for example. The mounting of spring leaf 81 has the advantage of not necessitating an adhesive or solder layer between optical element 16 and floor 14.

The package embodiment of FIG. 6 comprises an optical element 82, such as a photodiode, which is directly mounted on the floor and whose optical axis is not in the plane of other optical components 16 and 18. Photodiode 82 can be used as a back facet power monitor.

The package embodiment of FIG. 6 further comprises an electronic component 84, such as an impedance matching resistor, mounted onto floor 14 and electrically connected to wire bond 42 and conductive pattern 44. Anyone of ordinary skill in the art will appreciate that any other electronic element such as, for example, thermistors, chokes, integrated circuits can be mounted and connected in a similar way inside the optoelectronic package.

The package of FIG. 6 also contains peripheral contact pads 88 on the top surface of substrate 12. Contact pads 88 are connected to inside electrical elements 84 through via 86, bottom conductive pattern 48, filled via 46 and top conductive pattern 44.

Figure 7:
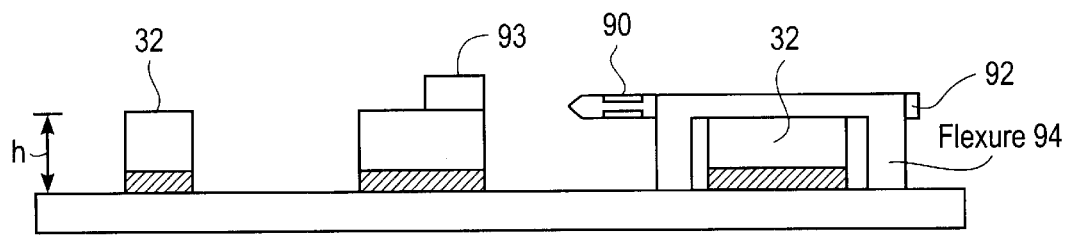
FIG. 7 shows a side sectional view of a third embodiment of the package for optical components.

FIG. 7 shows another embodiment of the optical package. In this embodiment, fiber 92 comprises a distributed Bragg reflection (DBR) grating 90 held in place by flexure 94. Laser 93 emits light into fiber 92. In one embodiment, laser 93 has an antireflection coated or angled front facet to prevent reflection of the light by the facet into the laser waveguide. Grating 90 strongly reflects a predetermined wavelength back into laser 93. A well-known adhesive or bonding technique may be used to mount the elements and/or the raised platforms supporting such elements. A laser system is thereby created, having a laser cavity that comprises grating 90 as well as the cavity of laser 93. The laser system of FIG. 7 has a resonant wavelength equal to the predetermined wavelength that corresponds to grating 90. The advantage of this embodiment is the superior mechanical stability of the fiber position with respect to the laser facet, which prevents the occurrence of mode hops, and lowers assembly cost.

Whereas many alterations and modifications of the present invention will no doubt become apparent to a person of ordinary skill in the art after having read the foregoing description, it is to be understood that any particular embodiment shown and described by way of illustration is in no way intended to be considered limiting. Therefore, references to details of various embodiments are not intended to limit the scope of the claims which in themselves recite only those features regarded as essential to the invention.

I claim:

1. An optoelectronic package comprising:
   a substrate having a first electrically conductive pattern on a first side and a second electrically conductive pattern on a second side, wherein the first and second electrically conductive patterns are coupled together by one or more hermetic vias;
   a first optical element mounted on a raised platform on the substrate;
   a second optical element coupled to the substrate and in optical alignment with the first optical element; and
   a flexure coupled to the second optical element and the substrate to maintain the optical alignment, wherein the flexure comprises:
   at least two legs;
   a bridge; and
   a pair of spring regions coupling the bridge to the at least two legs.

2. The optoelectronic package defined in claim 1 further comprising one or more contacts coupled to the one or more vias.

3. The optoelectronic package defined in claim 2 wherein the one or more contacts comprise one or more pins.

4. The optoelectronic package defined in claim 2 wherein one or more of the contacts comprise one or more ball grid array (BGA) contacts.

5. The optoelectronic package defined in claim 1 further comprising a frame attached to the substrate, wherein legs of the flexure are attached to the frame.

6. The optoelectronic package defined in claim 1 further comprising a protruding arm attached to the substrate.

7. The optoelectronic package defined in claim 6 wherein the protruding arm comprises a groove to permit hermetic passage of a third optical element to a location external to the package.

8. The optoelectronic package defined in claim 1 wherein the at least two legs comprises:
   a first pair of legs; and
   a second pair of legs,
   wherein the bridge is coupled to the first and second pair of legs and wherein the pair of spring regions couples the bridge to the first and second pair of legs.

9. The optoelectronic package defined in claim 1 further comprising a cap coupled to the substrate causing creation of a seal around the first optical element and the second optical element.

10. The optoelectronic package defined in claim 9 wherein the seal comprises a hermetic seal.

* * * * *